(12) United States Patent
La

(10) Patent No.: US 6,483,769 B2
(45) Date of Patent: Nov. 19, 2002

(54) SDRAM HAVING POSTED CAS FUNCTION OF JEDEC STANDARD

(75) Inventor: One-gyun La, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/847,791

(22) Filed: May 2, 2001

(65) Prior Publication Data

US 2002/0048197 A1 Apr. 25, 2002

(30) Foreign Application Priority Data

Oct. 24, 2000 (KR) .................................. 2000-62608

(51) Int. Cl.[7] ................................................ G11C 8/00
(52) U.S. Cl. ...................................... 365/233; 365/194
(58) Field of Search ................................ 365/233, 193, 365/195, 191, 194, 230.06

(56) References Cited

U.S. PATENT DOCUMENTS 5,808,961 A * 9/1998 Sawada ....................... 365/233
6,151,270 A * 11/2000 Jeong ......................... 365/233
6,289,413 B1 * 9/2001 Rogers ........................ 711/105

* cited by examiner

Primary Examiner—Amir Zarabian
(74) Attorney, Agent, or Firm—F. Chau & Associates, LLP

(57) ABSTRACT

A synchronous semiconductor memory device satisfying the CAS function requirement of JEDEC is provided. Through command input pins and address input pins, external command signals and address signals are applied. A command decoder decodes the applied command signals. A write command latency control unit, a read command latency control unit, and a column address latency control unit delay a write command, a read command, and a column address signal, respectively, for a time period equal to N/2 times a clock signal cycle in response to a latency control signal. N is an integer equal to or greater than zero, and the latency control signal is activated in response to a value set in an extended mode register set.

9 Claims, 3 Drawing Sheets

SDRAM HAVING POSTED CAS FUNCTION OF JEDEC STANDARD

BACKGROUND OF THE INVENTION

1. Technical Field

The present invention relates to semiconductor devices and, in particular, to a synchronous dynamic random access memory (SDRAM) operating in synchronization with a clock signal.

2. Description of Related Art

Generally, a read operation or a write operation of a synchronous dynamic random access memory (SDPAM) is controlled in synchronization with a clock signal applied external of the memory chip. In a DRAM, a column address strobe (CAS) command, such as a write command or a read command, can be provided a predetermined time after a row address strobe (RAS) activation command is provided. This predetermined time is referred to as a RAS to CAS delay (tRCD). That is, a read command or a write command can be provided a tRCD after an RAS activation command. In an SDRAM, a tRCD generally takes two or three clock cycles. Since a clock cycle is represented by a tCC, the tRCD is two or three tCC.

Therefore, in a conventional SDRAM, considering a tRCD, the controller for the SDRAM should provide a read command or a write command at an appropriate time after an RAS activation command. In this conventional method, the controller for an SDRAM or a user should consider the tRCD specification of the SDRAM, and the decrease in usage efficiency of a bus between the controller and the SDRAM command input pins. Due to these problems, an international electronics standardization organization, namely the Joint Electronic Device Engineering Council (JEDEC), proposed to add a CAS latency function (also referred to as a posted CAS function) and set up a standard corresponding thereto. JEDEC proposes a posted CAS function in a double data rate 2 (DDR2) SDRAM, which is an upgraded version of a DDR SDRAM. Also, the proposed JEDEC standards require that the tCC for an additive CAS latency be set in advance using an extended mode register set (EMRS) of an SDRAM.

SUMMARY OF THE INVENTION

The problems stated above, as well as other related problems of the prior art, are solved by the present invention, a synchronous semiconductor memory device having a posted column address strobe (CAS) function. The present invention provides an SDRAM that enhances the usage efficiency of a bus between the SDRAM and an external controller, and satisfies the posted CAS function requirement promulgated by JEDEC.

According to an aspect of the invention, there is provided a synchronous semiconductor memory device having a posted column address. strobe (CAS) function. The synchronous semiconductor memory device includes one or more command input pins for receiving command signals applied externally with respect to the memory device. A command decoder receives the command signals and outputs decoded commands corresponding to the command signals. A write command latency control unit receives a write command from among the decoded commands output from the command decoder, delays the write command for a time period equal to N/2 times a clock signal cycle in response to a predetermined latency control signal, and outputs the delayed write command. N is an integer equal to or greater than zero. The predetermined latency control signal is activated in response to a value set in an extended mode register set of the memory device.

According to another aspect of the invention, there is provided a synchronous semiconductor memory device having a posted column address strobe (CAS) function. The synchronous semiconductor memory device includes one or more command input pins adapted to receive command signals applied externally with respect to the memory device. A command decoder receives the command signals and outputs decoded commands corresponding to the command signals. A read command latency control unit receives a read command from among the decoded commands output from the command decoder, delays the read command for a time period equal to N/2 times a clock signal cycle in response to a predetermined latency control signal, and outputs the delayed read command. N is an integer equal to or greater than zero. The predetermined latency control signal is activated in response to a value set in an extended mode register set.

According to yet another aspect of the invention, there is provided a synchronous semiconductor memory device having a posted column address strobe (CAS) function. The synchronous semiconductor memory device includes one or more address input pins adapted to receive an address signal applied externally with respect to the memory device. A column address determining unit receives the address signal, and outputs the address signal to a column address path when the address signal is a column address signal. A column address latency control unit, located on the column address path, delays the column address signal for a time period equal to N/2 times a clock signal cycle in response to a predetermined latency control signal, and outputs the delayed column address signal. N is an integer equal to or greater than zero. The predetermined latency control signal is activated in response to a value set in an extended mode register set.

According to yet still another aspect of the invention, there is provided a synchronous semiconductor memory device having a posted column address strobe (CAS) function. The synchronous semiconductor memory device includes one or more command input pins adapted to receive command signals applied from the outside. A command decoder receives the command signals and outputs decoded commands corresponding to the command signals. A write command latency control unit receives a write command from among the decoded commands output from the command decoder, delays the write command for a time period equal to N/2 times a clock signal cycle in response to a predetermined latency control signal, and outputs the delayed write command. A read command latency control receives a read command from among the decoded commands output from the command decoder, delays the read command for a time period equal to N/2 times the clock signal cycle in response to the predetermined latency control signal, and outputs the delayed read command. N is an integer equal to or greater than zero. The predetermined latency control signal is activated in response to a value set in an extended mode register set.

According to a further aspect of the invention, there is provided a synchronous semiconductor memory device having a posted column address strobe (CAS) function. The synchronous semiconductor memory device includes one or more command input pins for receiving command signals applied externally with respect to the memory device. One or more address input pins receive an address signal applied externally with respect to the memory device. A command decoder receives the command signals and outputs decoded commands corresponding to the command signals. A write command latency control unit receives a write command from among the decoded commands output from the command decoder, delays the write command for a time period equal to N/2 times a clock signal cycle in response to a predetermined latency control signal, and outputs the delayed write command. A read command latency control unit receives a read command from among the decoded commands output from the command decoder, delays the read command for the time period equal to N/2 times the clock signal cycle in response to the predetermined latency control signal, and outputs the delayed read command. A column address determining unit receives the address signal, and outputs the address signal to a column address path when the address signal is a column address signal. A column address latency control unit, located on the column address path, delays the column address signal for the time period equal to N/2 times the clock signal cycle in response to the predetermined latency control signal, and outputs the delayed column address signal. N is an integer one of equal to and greater than zero. The predetermined latency control signal is activated in response to a value set in an extended mode register set.

These and other aspects, features and advantages of the present invention will become apparent from the following detailed description of preferred embodiments, which is to be read in connection with the accompanying drawings.

DETAILED DESCRIPTION OF PREFERRED EMBODIMENTS

A description of a posted CAS function according to JEDEC will now be described in detail. As noted above, the JEDEC standards request that the tCC for an additive CAS latency be set in advance by a user through an extended mode register set (EMRS) of an SDRAM. For example, it is presumed that a user uses an SDRAM for which tRCD is equal to 3CLK. If the SDRAM user wants to provide a write command or a read command 3CLK after an RAS activation command, then the posted CAS mode is set to mode "0" in the EMRS. In this case, the SDRAM does not internally provide an additive CAS latency to a write command or a read command. If the user wants to provide a write command or a read command 2CLK after an RAS activation command, then the posted CAS mode is set to mode "1" in the EMRS. In this case, the SDRAM internally provides an additive 1CLK CAS latency. If the user sets the posted CAS mode to mode "2", then the SDRAM internally provides an additive 2CLK CAS latency. The operations of an SDRAM having these posted CAS function are shown in FIGS. 1A–C.

Figure 1A:
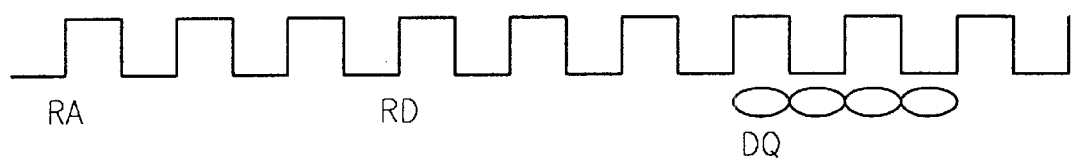
FIGS. 1A–C are timing diagrams for illustrating a posted column address strobe (CAS) function of a synchronous dynamic random access memory(SDRAM), according to an illustrative embodiment of the invention.
Figure 1B:
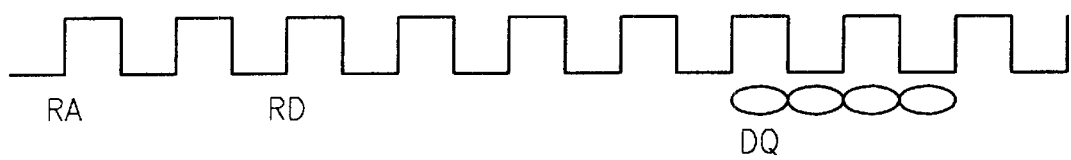
Figure 1C:
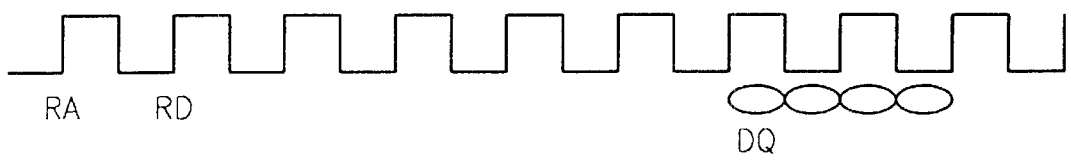

FIGS. 1A–C are timing diagrams for illustrating a posted column address strobe (CAS) function of a synchronous dynamic random access memory (SDRAM), according to an illustrative embodiment of the invention. Here, it is presumed that the tRCD is 3CLK, the CAS latency is "3", and the burst length is "4". A case in which an additive CAS latency is provided for a read command is shown in FIGS. 1A–C.

FIG. 1A is a timing diagram illustrating when the posted CAS mode is set to mode "0". Mode "0" indicates a case where an additive CAS latency is not provided. Therefore, a read command (RD) should be applied 3CLK (which is the tRCD) after an RAS activation command (RA). The read data (DQ) is output 3CLK (which is the CAS latency) after the read command.

FIG. 1B is a timing diagram illustrating when the posted CAS mode is set to mode "1". Mode "1" indicates a case where an additive CAS latency is 1CLK. Therefore, a read command (RD) should be applied 2CLK after an RAS activation command (RA). The read data (DQ) is output 4CLK, which is obtained by adding the additive CAS latency (1CLK) to the CAS latency (3CLK), after the read command.

FIG. 1C is a timing diagram illustrating when the posted CAS mode is set to mode "2". Mode "2" indicates a case where an additive CAS latency is 2CLK. Therefore, a read command (RD) should be applied 1CLK after an RAS activation command (RA). The read data (DQ) is output 5CLK, which is obtained by adding the additive CAS latency (2CLK) to the CAS latency (3CLK), after the read command. As is understood by one of ordinary skill in the related art, a time for outputting the read data (DQ) from the RAS activation command (RA) is fixed. However, if a posted CAS latency function is used, then a time for applying the read command (RD) from the RAS activation command (RA) can be adjusted.

Figure 2:
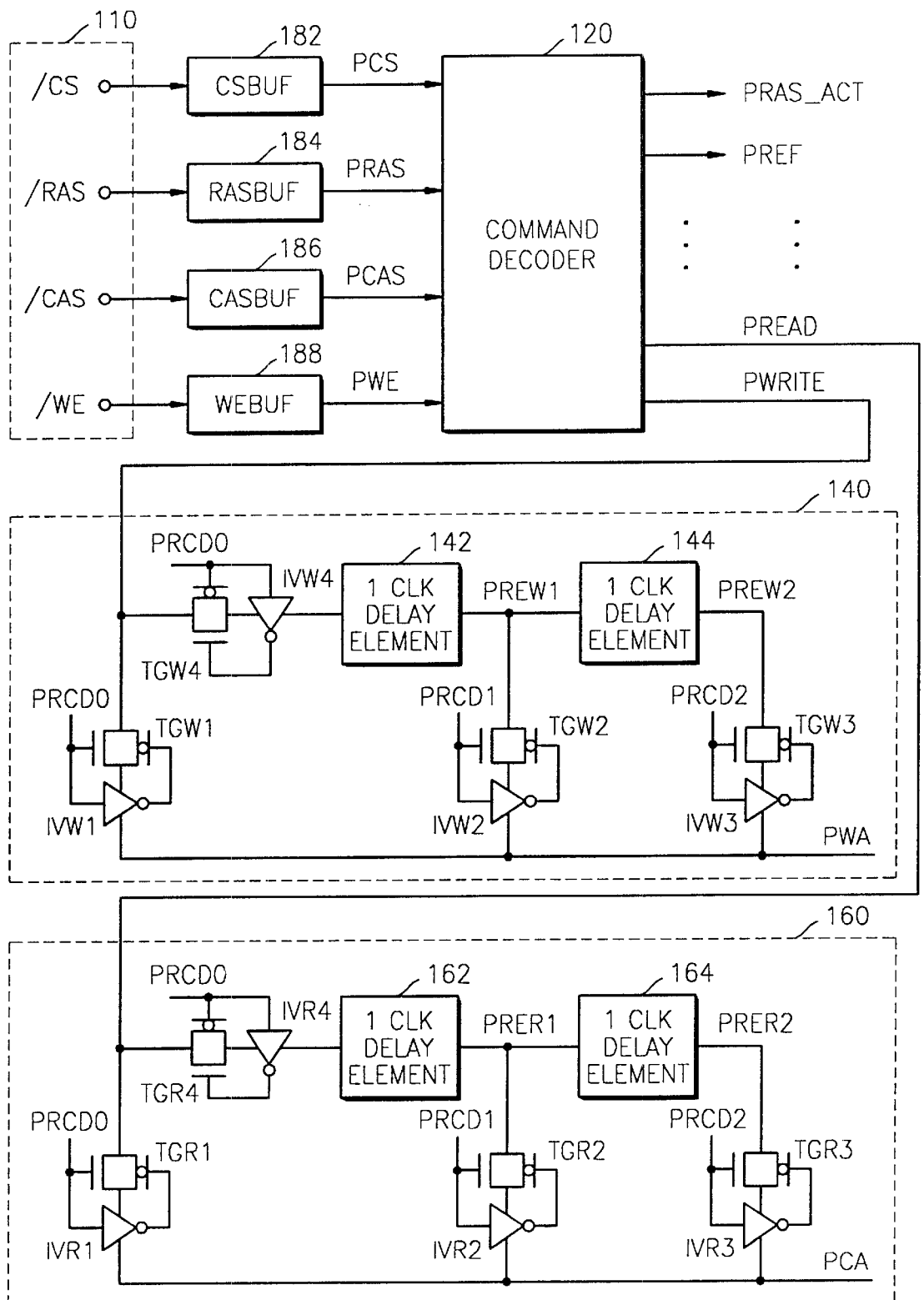
FIG. 2 is a diagram illustrating an SDRAM having a posted CAS function, according to an illustrative embodiment of the present invention.

FIG. 2 is a diagram illustrating an SDRAM having a posted CAS function, according to an illustrative embodiment of the present invention. The SDRAM has one or more command input pins 110, command input buffers 182 through 188, a command decoder 120, a write command latency control unit 140, and a read command latency control unit 160.

To the command input pins 110, command signals (/CS, /RAS, /CAS, and /WE) are applied from the outside (i.e., externally with respect to the semiconductor memory device. The command signals (/CS, /RAS, /CAS, and /WE), which are input at transistor-transistor logic (TTL) levels, are converted to complementary MOS (CMOS) levels by each of the command input buffers 182 through 188. The command decoder 120 receives and decodes command signals (PCS, PRAS, PCAS, PWE) input through the command input buffers 182 through 188, and outputs decoded commands (PRAS_ACT, PREF, . . . , PREAD, PWRITE) corresponding to the command signals (PCS, PRAS, PCAS, PWE).

The write command latency control unit 140 receives the write command (PWRITE) among the decoded commands (PRAS_ACT, PREF, . . . , PWRITE) output from the command decoder 120, and, in response to a predetermined latency control signal, delays the write command (PWRITE) for a time equivalent to N/2 times the clock signal cycle, and outputs the delayed write command (PWA). Here, since N is an integer equal to or greater than "0", the write command (PWRITE) can be delayed by 0, 0.5, 1, 1.5, . . . times.

The write command latency control unit 140 will now be explained in detail. The write command latency control unit 140 has a first delay element 142, a second delay element 144, and a first write transmission gate through a fourth write transmission gate TGW1 through TGW4. The first and second delay elements 142 and 144 delay input signals for a clock signal cycle (1CLK). Each of the first through fourth write transmission gates TGW1 through TGW4 are gated by an input control signal. Each of the first through fourth write transmission gates TGW1 through TGW4 have a structure in which a PMOS transistor is connected in parallel to an NMOS transistor. That is, the drain of the PMOS transistor is connected to the source of the NMOS transistor, and the source of the PMOS transistor is connected to the drain of the NMOS transistor. The control signal is input to the gate of the PMOS transistor and the inverted control signal is input to the gate of the NMOS, or the control signal is input to the gate of the NMOS transistor and the inverted control signal is input to the gate of the PMOS.

A first control signal (PRCD0) is input to the NMOS transistor of the first write transmission gate TGW1, and the inverse of the first control signal (PRCD0) is input to the PMOS transistor of the first write transmission gate TGW1. Therefore, if the first control signal (PRCD0) is activated to "a high level", then the first write transmission gate TGW1 is turned on. Otherwise, if the first control signal (PRCD0) is deactivated to "a low level", then the first write transmission gate TGW1 is turned off. If the first transmission gate TGW1 is turned on, then the write command (PWRITE) is output directly as a delayed write command (PWA).

A second control signal (PRCD1) is input to the NMOS transistor of the second write transmission gate TGW2, and the inverse of the second control signal (PRCD1) is input to the PMOS transistor of the second write transmission gate TGW2. Therefore, if the second control signal (PRCD1) is activated to "a high level", then the second write transmission gate TGW2 is turned on. Otherwise, if the second control signal (PRCD1) is deactivated to "a low level", then the second write transmission gate TGW2 is turned off. If the second transmission gate TGW2 is turned on, then the output signal (PREW1) of the first write delay element 142 is output as a delayed write command (PWA).

A third control signal (PRCD2) is input to the NMOS transistor of the third write transmission gate TGW3, and the inverse of the third control signal (PRCD2) is input to the PMOS transistor of the third write transmission gate TGW3. Therefore, if the third control signal (PRCD3) is activated to "a high level", then the third write transmission gate TGW3 is turned on. Otherwise, if the third control signal (PRCD2) is deactivated to "a low level", then the third control signal (PRCD3) is turned off. If the third transmission gate TGW3 is turned on, the output signal (PREW2) of the second write delay element 144 is output as a delayed write command (PWA).

The first control signal (PRCD0) is input to the PMOS transistor of the fourth write transmission gate TGW4, and the inverse of the first control signal (PRCD0) is input to the NMOS transistor of the fourth write transmission gate TGW4. Therefore, if the first control signal (PRCD0) is activated to "a high level", then the fourth write transmission gate TGW4 is turned off. Otherwise, if the first control signal (PRCD0) is deactivated to "a low level", then the fourth write transmission gate TGW4 is turned on. If the fourth transmission gate TGW4 is turned on, then the write command (PWRITE) is input to the first write delay element 142.

The additive CAS latency is set by information bits stored in the extended mode register set (EMRS) in the SDRAM. For example, when an EMRS command of the SDRAM is input, values applied to predetermined address signals are stored in the EMRS, and the additive CAS latency is determined by the values. The first control signals through the third control signal are latency control signals. According to an additive CAS latency value set in the EMRS, a corresponding signal among the first control signal through the third control signal is activated to "a high level", and the remaining control signals are inactivated.

The delayed write. command (PWA) is a master signal for a write operation, controlling the processes for writing data of the SDRAM having the posted CAS function of the present invention, and corresponds to a write command of an ordinary SDRAM not having the posted CAS function. Therefore, by using the delayed write command (PWA) in a place where a write command (PWRITE) of an ordinary SDRAM is used, the write operation processes. of the SDRAM having the posted CAS function of the present invention are internally the same as the write operation processes of ordinary SDRAMs.

The read command latency control unit 160 receives a read command (PREAD) among decoded commands output from the command decoder 120, and, in response to a latency control signal, delays the read command (PREAD) for a time equivalent to (½×an integer, that is, any one of 0, 0.5, 1, 1.5, . . . ) times the clock signal cycle, and outputs the delayed read command (PCA).

The structure of the read command latency control unit 160 is the same as that of the write command latency control unit 140. However, signals input to and output from the read command latency control unit 160 are a read command (PREAD) and a delayed read command (PCA), respectively, which are different than those input to and output from the write command latency control unit 140.

The read command latency control unit 160 will now be explained in detail. The read command latency control unit 160 has a first delay element 162, a second element 164, and a first read transmission gate through a fourth read transmission gate TGR1 through TGR4. Similar to the first and second write delay elements 142 and 144, the first and second read delay elements 162 and 164 delay input signals for a clock signal cycle (1CLK). The structures of the first through the fourth read transmission gates TGR1 through TGW4 are the same as the structures of the first through the fourth write transmission gates TGW1 through TGW4, respectively.

Control signals input to the first through the fourth read transmission gates TGR1 through TGR4 are the same as the control signals input to the first through the fourth write transmission gates TGW1 through TGW4. Therefore, if a first control signal (PRCD0) is activated, then the first read transmission gate TGR1 is turned on, and the read command (PREAD) is output directly as a delayed read command (PCA). At this time, the fourth read transmission gate TGR4 is turned off, and the read command (PREAD) is not provided to the first read delay element 162.

If a second control signal (PRCD1) is activated, since the first control signal (PRCD0) is in an inactivated state, the fourth read transmission gate TGR4 is turned on, and the read command (PREAD) is transmitted to the first read delay element 162. Also, the second read transmission gate TGR2 is turned on, and the output signal (PRER1) of the first read delay element 62 is output as a delayed read command (PCA).

If a third control signal (PRCD2) is activated, then the output signal (PRER2) of the second read delay element 164 is output as a delayed read command (PCA).

The delayed read command (PCA) is a master signal for a read operation, controlling the processes for reading data of the SDRAM of the present invention, and corresponds to a read command of an ordinary SDRAM not having the posted CAS function of the present invention. Therefore, by using the delayed read command (PCA) in place of a read command (PREAD) of an ordinary SDRAM, the read operation processes of the SDRAM having the posted CAS function are internally the same as the read operation processes of ordinary SDRAMs.

Figure 3:
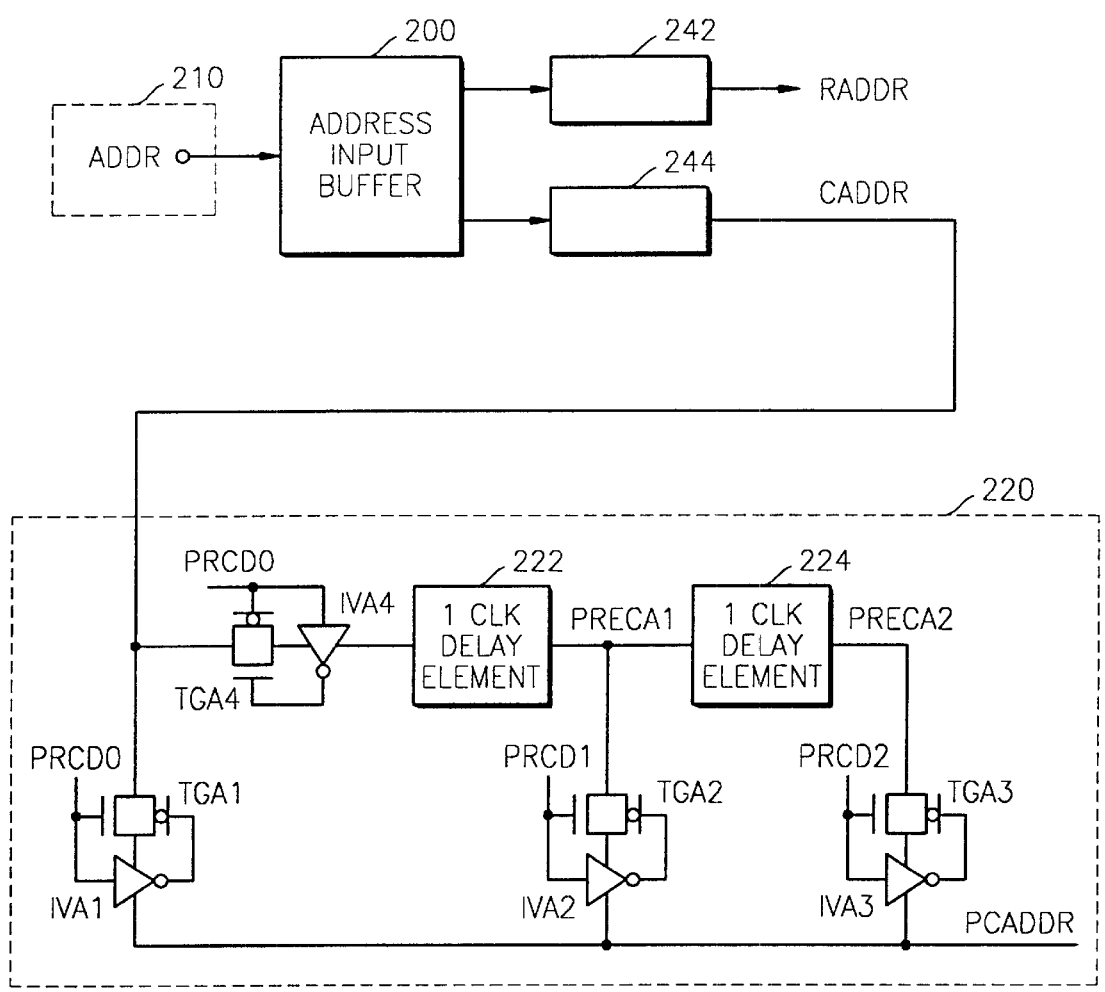
FIG. 3 is a diagram illustrating an SDRAM having a posted CAS function, according to another illustrative embodiment of the present invention.

FIG. 3 is a diagram illustrating an SDRAM having the posted CAS function, according to a second illustrative embodiment of the present invention. The SDRAM has one or more address input pins 210, an address input buffer 200, a row address determining unit 242, a column address determining unit 244, and a column address latency control unit 220.

To the address input pins 210, an address signal (ADDR) is applied from the outside. The address input buffer 200 converts the TTL-level address signal (ADDR) input through the address input pins 210 to a CMOS-level signal.

If the received address signal (ADDR) is a row address signal, the row address determining unit 242 outputs the signal to a row address path. Likewise, if the received address signal (ADDR) is a column address signal, the column address determining unit 244 outputs the signal to a column address path. A row address signal (RADDR) is input to a row address decoder (not shown) through the row address path. A column address signal (CADDR) is input to a column address decoder (not shown) through the column address path.

However, the SDRAM according to the second illustrative embodiment of the present invention has a column address latency control unit 220 on the column address path, that is, the path after the output of the column address determining unit 244 and before the column address decoder (not shown).

The column address latency control unit 220 receives the column address signal (CADDR) output from the column address determining unit 244, and, in response to a latency control signal, delays the column address signal (CADDR) for a time equivalent to (½×an integer, that is, any one of 0, 0.5, 1, 1.5, . . . ) times the clock signal cycle, and outputs the delayed column address signal (PCADDR).

The structure of the column address latency control unit 220 is also similar to that of the write command latency control unit 140 and that of the read command latency control unit 160. However, the column address latency control unit 220 is different from the write command latency control unit 140 and the read command latency control unit 160 in that the signals input to and output from the column address latency control unit 220 are the column address signal (CADDR) and the delayed column address signal (PCADDR).

The column address latency control unit 220 will now be explained in detail. The column address latency control unit 220 has a first column address delay element 222, a second column address delay element 224, and a first column address transmission gate through a fourth column address transmission gate TGA1 through TGA4. The functions of the first and the second column address delay elements 222 and 224 are the same as the functions of the first and second write command delay elements 142 and 144. The first through the fourth column address transmission gate TGA1 through TGA4 have the same structures and functions as the first through the fourth write command transmission gates TGW1 through TGW4. Therefore, an explanation of the structure and function of the column address latency control unit 220 is omitted for the sake of brevity.

The delayed column address signal (PCADDR) is decoded in the column address decoder (not shown) and selects the column which data is written to or read from, among memory cell array.

The column address latency control unit 220 can be included in a circuit for receiving a column address signal other than that shown in FIG. 3. In FIG. 3, after the address input buffer 200, it is determined whether an input signal is a row address signal or a column address signal. However, a row address buffer and a column address buffer can be included separately. In this case, the column address latency control unit 220 can be included in the column address buffer. If a column address decoder is divided into a main decoder and a pre-decoder, the column address latency control unit 220 can be implemented in the column address main decoder or in the column address predecoder.

In the embodiments of the present invention described above, each latency control unit 140, 160, and 220 has two delay elements. Therefore, the scope of an additive CAS latency that can be set is 2CLK. However, the number of delay elements can change, and according to the number of delay elements, the scope of an additive CAS latency value that can be set can be adjusted.

Thus, according to the present invention, when using an SDRAM, an external controller or a user can adjust the timing for applying a CAS command after an RAS activation command. Therefore, the usage efficiency of a bus between the SDRAM and the external controller using the SDRAM is enhanced. Also, the SDRAM of the present invention satisfies the posted CAS function requirement of JEDEC.

Although the illustrative embodiments have been described herein with reference to the accompanying drawings, it is to be understood that the present system and method is not limited to those precise embodiments, and that various other changes and modifications may be affected therein by one skilled in the art without departing from the scope or spirit of the invention. All such changes and modifications are intended to be included within the scope of the invention as defined by the appended claims. With respect to the FIGURES references above, it is to be appreciated that like reference numbers represent the same or similar elements.

What is claimed is:

1. A synchronous semiconductor memory device having a posted column address strobe (CAS) function, the synchronous semiconductor memory device comprising:

one or more command input pins for receiving command signals applied externally with respect to the memory device;

a command decoder for receiving the command signals and outputting decoded commands corresponding to the command signals; and a write command latency control unit for receiving a write command from among the decoded commands output from the command decoder, delaying the write command for a time period equal to N/2 intervals of a clock signal cycle in response to a predetermined latency control signal, and outputting the delayed write command, wherein N is an integer one of equal to and greater than zero, and the predetermined latency control signal is activated in response to a value set in an extended mode register set of the memory device, wherein the predetermined latency control signal includes a first control signal, a second control signal, and a third control signal, and the write command latency control unit comprises:
- a first write delay element for delaying the write command for the clock signal cycle, and outputting a first preliminary write command;
- a second write delay element for delaying the first preliminary write command for the clock signal cycle, and outputting a second preliminary write command;
- a first write transmission gate for outputting the write command as the delayed write command in response to the first control signal;
- a second write transmission gate for outputting the first preliminary write command as the delayed write command in response to the second control signal; and
- a third write transmission gate for outputting the second preliminary write command as the delayed write command in response to the third control signal.

2. The synchronous semiconductor memory device of claim 1, wherein the write command latency control unit further comprises a fourth write transmission gate for outputting the write command as an input signal to the first write delay element in response to the first control signal.

3. A synchronous semiconductor memory device having a posted column address strobe (CAS) function, the synchronous semiconductor memory device comprising:
- one or more command input pins for receiving command signals applied externally with respect to the memory device;
- a command decoder adapted for receiving the command signals and outputting decoded commands corresponding to the command signals; and
- a read command latency control unit for receiving a read command from among the decoded commands output from the command decoder, delaying the read command for a time period equal to N/2 intervals of a clock signal cycle in response to a predetermined latency control signal, and outputting the delayed read command, wherein N is an integer equal to or greater than zero, and the predetermined latency control signal is activated in response to a value set in an extended mode register set, wherein the predetermined latency control signal includes a first control signal, a second control signal, and a third control signal, and the read command latency control unit comprises:
- a first read delay element for delaying the read command for the clock signal cycle, and outputting a first preliminary read command;
- a second read delay element for delaying the first preliminary read command for the clock signal cycle, and outputting a second preliminary read command;
- a first read transmission gate for outputting the read command as the delayed read command in response to the first control signal;
- a second read transmission gate for outputting the first preliminary-read command as the delayed read command in response to the second control signal; and
- a third read transmission gate for outputting the second preliminary read command as the delayed read command in response to the third control signal.

4. The synchronous semiconductor memory device of claim 3, wherein the read command latency control unit further comprises a fourth read transmission gate for outputting the read command as an input signal to the first read delay element in response to the first control signal.

5. A synchronous semiconductor memory device having a posted column address strobe (CAS) function, the synchronous semiconductor memory device comprising:
- one or more address input pins for receiving an address signal applied externally with respect to the memory device;
- a column address determining unit adapted for receiving the address signal, and outputting the address signal to a column address path when the address signal is a column address signal; and
- a column address latency control unit, located on the column address patch, for delaying the column address signal for a time period equal to N/2 intervals of a clock signal cycle in response to a predetermined latency control signal, and outputting the delayed column address signal, wherein N is an integer equal to or greater than zero, and the predetermined latency control signal is activated in: response to a value set in an extended mode register set wherein the predetermined latency control signal includes a first control signal, a second control signal, and a third control signal, and the column address latency control unit comprises:
- a first column address delay element for delaying the column address signal for the clock signal cycle, and outputting a first preliminary column address signal;
- a second column address delay element for delaying the first preliminary column address signal for the clock signal cycle, and outputting a second preliminary column address signal;
- a first column address transmission gate for outputting the column address signal as the delayed column address signal in response to the first control signal;
- a second column address transmission gate for outputting the first preliminary column address signal as the delayed column address signal command in response to the second control signal; and
- third column address transmission gate for outputting the second preliminary column address signal as the delayed column address signal in response to the third control signal.

6. The synchronous semiconductor memory device of claim 3, wherein the column address latency control unit further comprises a fourth column address transmission gate for outputting the column address signal as an input signal to the first column address delay element in response to the first control signal.

7. The synchronous memory device of claim 5, further comprising:
- a column address buffer for converting a level of the column address signal, wherein the column latency control unit is included in the column address buffer.

8. The synchronous memory device of claim 5, further comprising:
- a column address decoder for decoding the column address signal, wherein the column latency control unit is included in the column address decoder.

9. The synchronous semiconductor memory device of claim 1, wherein said write command latency control unit is capable of delaying the write command by a time period having a non-integer value, when N is equal to an odd numbered integer.

* * * * *